(12) United States Patent
Yamaguchi et al.

(10) Patent No.: US 7,078,246 B2
(45) Date of Patent: *Jul. 18, 2006

(54) OPTICAL PROCESSING APPARATUS AND OPTICAL PROCESSING METHOD

(75) Inventors: Naoaki Yamaguchi, Yokohama (JP); Koichiro Tanaka, Atsugi (JP); Satoshi Teramoto, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/816,899

(22) Filed: Apr. 5, 2004

(65) Prior Publication Data

US 2004/0191945 A1 Sep. 30, 2004

Related U.S. Application Data (62) Division of application No. 10/035,441, filed on Jan. 4, 2002, now Pat. No. 6,716,283, which is a division of application No. 09/547,716, filed on Apr. 11, 2000, now Pat. No. 6,336,969, which is a division of application No. 08/451,648, filed on May 26, 1995, now Pat. No. 6,059,873.

(30) Foreign Application Priority Data

May 30, 1994 (JP) .................................. 6-139404

(51) Int. Cl.
*H01L 21/00* (2006.01)
(52) U.S. Cl. ................. 438/7; 438/16; 117/10
(58) Field of Classification Search .............. 117/7–10, 117/904; 427/10; 438/7–18, 80, 98
See application file for complete search history.

(56) References Cited

U.S. PATENT DOCUMENTS 4,332,833 A 6/1982 Aspnes et al.

(Continued)

FOREIGN PATENT DOCUMENTS

JP 05-243576 9/1993

(Continued)

OTHER PUBLICATIONS

G. Liu, S.J. Fonash, "Polycrystalline Silicon Thin Film Transistors on Corning 7059 Glass Substrates Using Short Time, Low Temperature Processing," Appl. Phys. Lett 62 (20), May 17, 1993, 1993 American Institute of Physics, pp. 2554-2556.

(Continued)

*Primary Examiner*—David Nelms
*Assistant Examiner*—Calvin Lee
(74) *Attorney, Agent, or Firm*—Eric J. Robinson; Robinson Intellectual Property Law Office, P.C.

(57) ABSTRACT

In an annealing process in which laser light is irradiated to a semiconductor thin film, a refractive index of the semiconductor thin film after laser light irradiation is measured and conditions for the next laser light irradiation are adjusted based on the measured refractive index value. For example, laser light irradiation conditions are adjusted so that semiconductor thin films always have the same refractive index. As a result, the annealing can be performed under the same conditions at every laser light irradiation even if the laser light irradiation conditions vary unavoidably.

18 Claims, 8 Drawing Sheets

U.S. PATENT DOCUMENTS

| | | | |
|---|---|---|---|
| 4,388,145 A | | 6/1983 | Hawkins et al. |
| 4,469,551 A | | 9/1984 | Laude |
| 4,609,407 A | * | 9/1986 | Masao et al. ............... 438/155 |
| 5,091,320 A | | 2/1992 | Aspnes et al. |
| 5,131,752 A | | 7/1992 | Yu et al. |
| 5,147,826 A | | 9/1992 | Liu et al. |
| 5,232,547 A | | 8/1993 | Drowley et al. |
| 5,240,581 A | | 8/1993 | Kim |
| 5,275,851 A | | 1/1994 | Fonash et al. |
| 5,294,518 A | * | 3/1994 | Brady et al. ............... 430/290 |
| 5,365,875 A | | 11/1994 | Asai et al. |
| 5,387,309 A | | 2/1995 | Bobel et al. |
| 5,454,347 A | | 10/1995 | Shibata et al. |
| 5,456,763 A | | 10/1995 | Kaschmitter et al. |
| 5,472,505 A | | 12/1995 | Lee et al. |
| 5,494,697 A | | 2/1996 | Blayo et al. |
| 5,503,707 A | | 4/1996 | Maung et al. |
| 5,529,630 A | * | 6/1996 | Imahashi et al. ........... 118/665 |
| 5,569,610 A | | 10/1996 | Zhang et al. |
| 5,624,851 A | | 4/1997 | Takayama et al. |
| 5,707,882 A | | 1/1998 | Hamada et al. |
| 5,747,201 A | | 5/1998 | Nakayama et al. |
| 5,772,861 A | | 6/1998 | Meredith, Jr. et al. |
| 5,773,309 A | | 6/1998 | Weiner |
| 5,808,318 A | | 9/1998 | Masumo et al. |
| 5,851,860 A | | 12/1998 | Makita et al. |
| 5,904,550 A | | 5/1999 | Yamaguchi |
| 6,054,739 A | | 4/2000 | Yamazaki et al. |
| 6,059,873 A | | 5/2000 | Yamaguchi et al. |

FOREIGN PATENT DOCUMENTS

| | | |
|---|---|---|
| JP | 06-204132 | 7/1994 |
| JP | 08-051078 | 2/1996 |

OTHER PUBLICATIONS

G. Liu and S.J. Fonash, "Selective Area Crystallization of Amorphous Silicon Films by Low-Temperature Rapid Thermal Annealing," Appl. Phys. Lett 55 (7), Aug. 14, 1989, American Institute of Physics, pp. 660-662.

R. Kakkad, G. Liu, S.J. Fonash, "Low Temperature Selective Crystallization of Amorphous Silicon," Journal of Non-Crystalline Solids, vol. 115, (1989), pp. 66-68.

F. Ueno "Observation of fast microscopic phase change phenomena of chalcogenide thin films," Japanese Journal of Applied Physics, Supplement, vol. 26, Supplement 26-4, pp. 55-60, 1987.

N. Kondo et al., "Film thickness measurement of ultrathin film using light of UV wavelength," Proceedings of the SPIE, vol. 1673, pp. 392-402, 1992.

C. Hayzelden et al., "*In Situ* Transmission Electron Microscopy Studies of Silicide-Mediated Crystallization of Amorphous Silicon," (3 pages) Appl. Phys. Lett. 60(2) pp. 225-227, Jan. 1992.

A. V. Dvurechenskii et al., "Transport Phenomena in Amorphous Silicon Doped by Ion Implantation of 3d Metals," USSR, pp. 635-640, Phys. Stat. Sol. (A) vol. 95, 1986.

T. Hempel et al., "Needle-Like Crystallization of Ni Doped Amorphous Silicon Thin Films," *Solid State Communications*, vol. 85, No. 11, pp. 921-924, 1993.

R. Kakkad, J. Smith, W.S. Lau, S.J. Fonash, "Crystallized Si Films by Low-Temperature Rapid Thermal Annealing of Amorphous Silicon," J. Appl. Phys. 65(5), Mar. 1, 1989, 1989 American Institute of Physics, pp. 2069-2072.

* cited by examiner

LASER LIGHT IRRADIATION

FIG. 5C

IMPURITY ION IMPLANTATION AND LASER LIGHT IRRADIATION

IRRADIATING LASER LIGHT TO ONE GLASS SUBSTRATE FORMED ON CRYSTALLINE SILICON FILM

FIG. 6B

MEASURING REFRACTIVE INDEX OF CRYSTALLINE SILICON FILM TO WHICH LASER LIGHT HAS BEEN IRRADIATED, BY ELLIPSOMETRY

FIG. 6C

INCREASING IRRADIATION ENERGY OF LASER LIGHT, IN CASE THAT REFRACTIVE INDEX OBTAINED BY THE FOREGOING IS LARGER THAN PRESCRIBED REFRACTIVE INDEX

BACK TO FIG.6A

FIG. 7A

IRRADIATING LASER LIGHT TO SOURCE/DRAIN REGION OF THIN FILM TRANSISTOR FORMED ON GLASS SUBSTRATE TO PERFORM ANNEALING

FIG. 7B

IRRADIATING LASER LIGHT TO CRYSTALLINE SILICON FILM EVERY AFTER COMPLETING TREATMENT FOR ONE SUBSTRATE, AND MEASURING REFRACTIVE INDEX OF CRYSTALLINE SILICON FILM AFTER IRRADIATION, BY ELLIPSOMETRY

FIG. 7C

INCREASING IRRADIATION ENERGY OF LASER LIGHT IN CASE THAT THE FOREGOING REFRACTIVE INDEX IS LARGER THAN PRESCRIBED VALUE, AND DECREASING IRRADIATION ENERGY OF LASER LIGHT IN CASE THAT THE FOREGOING REFRACTIVE INDEX IS SMALLER THAN THE PRESCRIBED VALUE

BACK TO FIG.7A

OPTICAL PROCESSING APPARATUS AND OPTICAL PROCESSING METHOD

This application is a Division of Ser. No. 10/035,441 Jan. 4, 2002 U.S. Pat. No. 6,716,283 which is a Division of Ser. No. 09/547,716 Apr. 11, 2000 U.S. Pat. No. 6,336,969 which is a Division of Ser No. 08/451,648 May 26, 1995 U.S. Pat. No. 6,059,873.

BACKGROUND OF THE INVENTION

The present invention relates to a technique of evaluating a processing effect of various processes using laser light. The invention also relates to a technique of relatively evaluating and controlling illumination energy of laser light.

"Low-temperature processes" are now being developed to manufacture a liquid crystal panel using polysilicon thin-film transistors (TFTs). This is intended to suppress the cost of a liquid crystal panel itself by using a low-temperature process, which allows use of a glass substrate with which a large-size substrate can be obtained at a low cost.

To realize a low-temperature process, the key subject is to crystallize an amorphous silicon film formed on a glass substrate by a heating process of less than about 600° C., a temperature range in which the glass substrate can endure. There is known a low-temperature process in which an amorphous silicon film is formed on a glass substrate by CVD and converted to a crystalline silicon film by illumination with excimer laser light. In this process, the amorphous silicon film is crystallized by instantaneously rendering the surface and its vicinity of the amorphous silicon film into a molten state.

A crystalline silicon film that has been crystallized by illumination with laser light, particularly excimer laser light, is advantageous in that it is close and has superior electrical characteristics. Further, a substrate receives very little thermal damage. However, the excimer laser light is associated with a problem that its illumination energy is unstable, resulting in a difficulty in keeping the optimum illuminating condition.

In the excimer laser, a particular gas is excited by subjecting high-frequency discharging to it, and electromagnetic waves are utilized, which are emitted when molecules of the gas transfer from the excited state to the steady state. Therefore, there exists a problem originating from the principle that when laser oscillation is continued, increase of impurities in the gas or change in quality of the gas itself lowers the laser light output even with application of the same discharge power. It is a general procedure to obtain a constant laser light output by using a calibration table or the like. But this is not always satisfactory. (For example, the illumination energy of laser light is greatly varied by contamination or the like in a discharge chamber.)

It has been proved that the characteristics of a thin-film transistor produced by using a crystalline silicon film that has been crystallized by illumination with laser light approximately depend on the illumination energy of laser light. Therefore, if the illumination energy of laser light can be made constant or a desired value, a thin-film transistor having intended characteristics can be obtained. This is not limited to the thin-film transistor, but also is widely applicable to other semiconductor devices that are produced by a process including laser light illumination.

There are several methods of evaluating the annealing effects of laser light illumination on a semiconductor. Examples of these techniques are disclosed in Japanese Unexamined Patent Publication Nos. Sho. 58-15943, Sho. 58-40331, and Hei. 1-16378.

In these methods, prescribed anneal effects of laser light illumination on a semiconductor, particularly its crystallinity, are measured by Raman spectroscopy, to evaluate the annealing effects. However, the Raman spectroscopy has the following problems.

(1) Bad reproducibility of measurements.

(2) Use of a large-output laser such as an Ar laser causes a problem in safety.

(3) An expensive apparatus is needed.

(4) A measurement takes long time.

It is difficult to evaluate the flatness of a film surface by the Raman spectroscopy, through the flatness of a film surface is an important factor of determining the characteristics of a thin-film transistor manufactured. Thus, a crystalline silicon film to be used for a thin-film transistor having desired characteristics cannot be evaluated sufficiently only by the Raman spectroscopy.

In the above circumstances, at present, in addition to the above-described evaluation using the Raman spectroscopy, the flatness of a film is evaluated by human eyes using an optical microscope or a SEM (scanning electron microscope).

As described above, at present, a crystalline silicon film is produced in the following manner, and a thin-film transistor having desired characteristics is formed by using the crystalline silicon film thus produced.

(A) In a process of crystallizing an amorphous silicon film by using excimer laser light, the optimum illumination condition of excimer laser light is found experimentally. And it is tried to always perform laser light illumination under the optimum condition.

(B) The optimum condition is set by evaluating the crystallinity of the film by the Raman spectroscopy and evaluating its flatness by visual observation.

However, as described above, the illumination energy of excimer laser light is liable to vary and it is difficult to control the illumination energy. As mentioned above as item (B), the evaluation of the effects of laser light illumination depends on the two parameters of the crystallinity evaluation by the Raman spectroscopy and the evaluation of the film flatness by visual observation. It is therefore difficult to control, using the two parameters, the illumination power of excimer laser light, which tends to gradually change, so that it is kept at the optimum value.

SUMMARY OF THE INVENTION

The present invention is intended to attain at least one of the following objects.

(1) To provide a technique capable of judging, on a realtime basis, the effects of various processes using laser light, such as a process of improving the quality of a thin film and annealing of a thin film.

(2) To provide a technique capable of performing laser light illumination while making control for always maintaining the optimum condition in a process of improving the quality of a thin film and annealing of a thin film both using laser light.

(3) To provide a technique capable of easily evaluating the crystallinity of a silicon thin film in a crystallization process of a silicon thin film using laser light.

(4) To provide a technique capable of easily evaluating the crystallinity of a silicon thin film and the flatness of its surface in a crystallization process of a silicon thin film using laser light.

(5) To provide a technique of controlling the illumination energy of laser light so that it is always kept close to a predetermined value.

According to one of principal aspects of the invention, there is provided an optical processing method comprising the steps of:

forming a semiconductor thin film on a substrate having an insulative surface;

irradiating laser light or high-intensity light onto the thin film;

measuring a refractive index of the thin film to which the laser light or the high-intensity light has been irradiated; and controlling an illumination energy of the laser light or the high-intensity light based on the measured refractive index.

In the above method, examples of the substrate having an insulative surface are a glass substrate, a quartz substrate, other various insulative substrates, semiconductor substrates or conductor substrates on which an insulative film is formed, and substrates of other materials on which an insulative film is formed.

Examples of the thin film are an amorphous silicon film and a crystalline silicon film which are semiconductor thin films. The conductivity type of a semiconductor is not limited specifically. Other examples of the thin film are thin films made of an oxide material, a nitride material, a metal material, or an organic material, i.e., a material whose quality is changed by illumination with laser light or high-intensity light.

Examples of laser light are excimer laser light of KrF, ArF or XeCl. High-intensity light may have any necessary wavelength from the ultraviolet range to the infrared range. A laser beam may have any shape suitable for each use, such as a rectangular shape, a linear shape, a point-like shape, or a planar shape.

An example of the method of measuring the refractive index of a thin-film is a method using ellipsometry.

An example of the method of controlling the illumination energy of laser light or high-intensity light is, in the case of excimer laser light, a method of controlling the discharge output.

The above processing method is characterized by evaluating the effects of the laser light illumination by measuring the refractive index of semiconductor thin film whose quality has been changed by the illumination with laser light. For example, a desired effect can always be obtained by controlling the laser light illumination energy so as to always produce a particular refractive index. Or an effect of the laser light illumination can be made within a certain range by causing the refractive index of a laser-light-irradiated semiconductor film to fall within a predetermined range.

According to another principal aspect of the invention, there is provided an optical processing method comprising the steps of:

forming an amorphous silicon film on a substrate having an insulative surface;

crystallizing the amorphous silicon film with the aid of at least one element for facilitating crystallization of the amorphous silicon film;

irradiating laser light or high-intensity light to the crystallized silicon film;

measuring a refractive index of the silicon film to which the laser light or the high-intensity light has been irradiated; and controlling an irradiation energy of the laser light or the high-intensity light based on the measured refractive index.

The above method is characterized in that the silicon film to be irradiated with laser light is a film that has been crystallized with the aid of at least one element for facilitating crystallization. The at least one element may be one or a plurality of elements selected from Ni, Pd, Pt, Cu, Ag, Au, In, Sn, Pb, As and Sb. In particular, remarkable effects can be obtained when Ni is used. Specifically, an amorphous silicon film can be crystallized to obtain a crystalline silicon film by introducing the element for facilitating crystallization into the amorphous silicon film and the subjecting it to a heat treatment. The heat treatment can be performed at a temperature lower more than 50° C. compared with the case where no catalyst element for facilitating crystallization is used. In addition, heating damage to the substrate (particularly a glass substrate) can be greatly reduced.

The at least one elements for facilitating crystallization may be one or a plurality of elements selected from the elements of VIII, IIIb, IVb and Vb families.

According to still another principal aspect of the invention, there is provided an optical processing apparatus comprising:

means for irradiating laser light or high-intensity light to a thin film; and means for controlling irradiation energy of the laser light or the high-intensity light based on a refractive index of the thin film to which the laser light or the high-intensity light has been irradiated.

In the above processing apparatus, an example of the means for controlling the irradiation energy of laser light or high-intensity light is a mechanism of controlling discharge power of an excimer laser, for example.

In the above processing apparatus, the irradiation energy of laser light or high-intensity light can be made equal or close to a predetermined value, or within a predetermined range by controlling the irradiation energy of laser light or high-intensity light so that the refractive index of the thin film becomes a predetermined value or falls within a predetermined range. Further, by repeating the above operation, the refractive index value can be gradually made close to a predetermined value.

The irradiation energy of laser light can be evaluated in a relative manner by measuring the refractive index of a thin film whose quality has been changed by irradiation with laser light. For example, the irradiation energy of laser light can always be made close to a particular value by adjusting the laser light irradiation energy so as to always produce a constant refractive index. Therefore, even where the irradiation energy of laser light is liable to vary, the variation can be made as small as possible by monitoring the irradiation energy value using the refractive index. In other words, by measuring the refractive index of a thin film whose quality is changed by the irradiation with laser light, a variation of the laser light irradiation energy value can be monitored and the refractive index can be caused to have a predetermined value or fall within a predetermined range. Further, the laser light irradiation energy value can be caused to have a predetermined value or fall within a predetermined range. By utilizing this fact, the effects of the laser light irradiation can be made predetermined ones.

Figure 4:
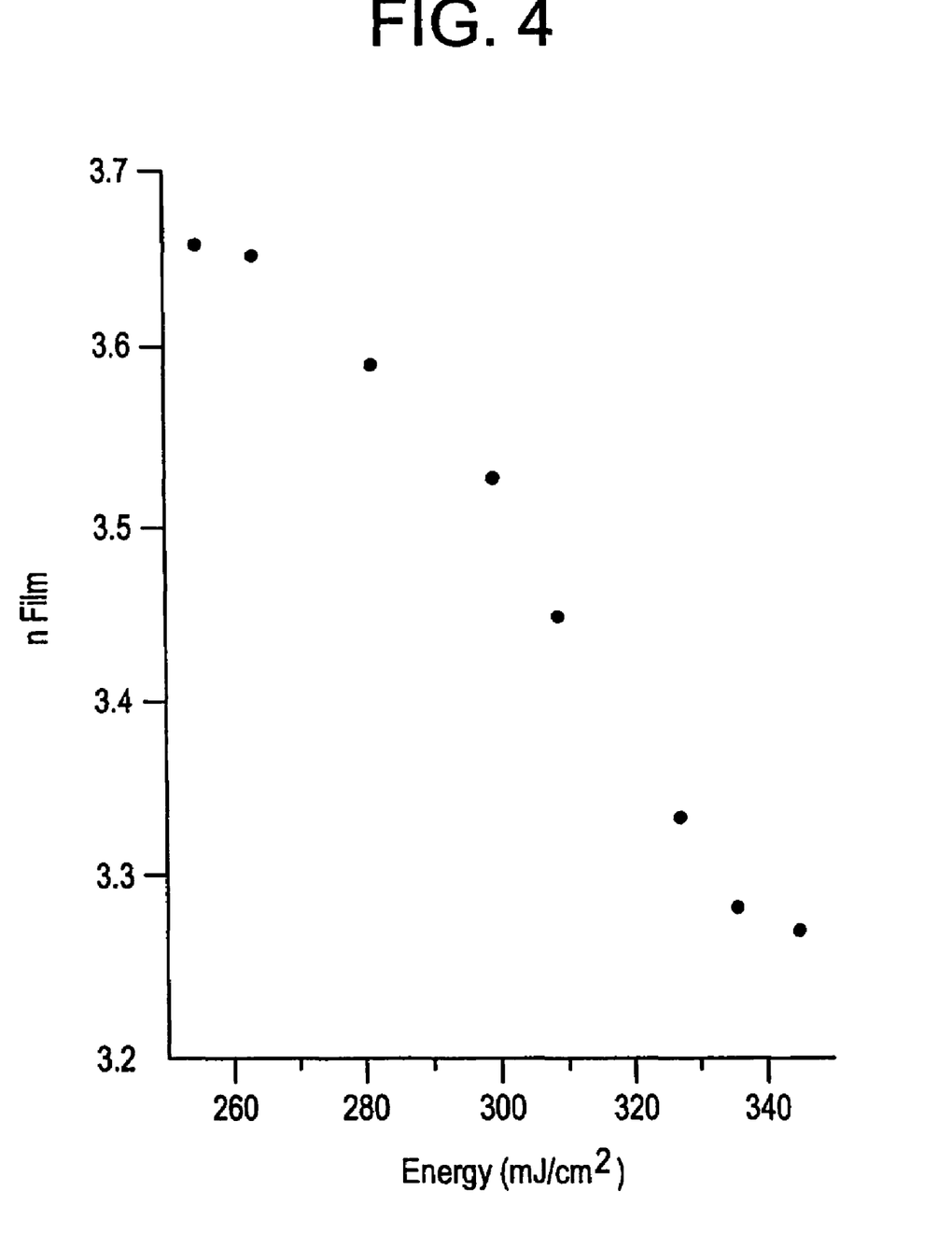
FIG. 4 is a graph showing a relationship between the irradiation energy density of laser light and the refractive index of a crystalline silicon film obtained by the laser light irradiation.

For example, FIG. 4 shows experimental data representing a relationship between the irradiation energy density of laser light and the refractive index n of a silicon thin film whose crystallinity has been improved by the laser light irradiation. Based on this graph, the refractive index of a silicon thin film can be made close to a predetermined value by increasing the laser light irradiation energy density in the next irradiating operation when the refractive index n of a silicon thin film is larger than a predetermined value, and decreasing the laser light irradiation energy density in the next irradiating operation when the refractive index n of a silicon thin film is smaller than the predetermined value.

With the above operation, even where the laser light irradiation energy density is liable to vary, the variation can be recognized from the refractive index of a silicon film whose crystallinity has been improved by the laser light irradiation, so that the laser light irradiation density can be so controlled as to always allow laser light irradiation at a predetermined energy density. Thus, the effects of laser light irradiation can be made constant.

DESCRIPTION OF THE PREFERRED EMBODIMENTS

Embodiment 1

This embodiment is directed to a system and a method of evaluating states (which are defined as a concept including the crystallinity and the flatness of a film) of a silicon film that has been crystallized by illumination with excimer laser light.

Figure 1:
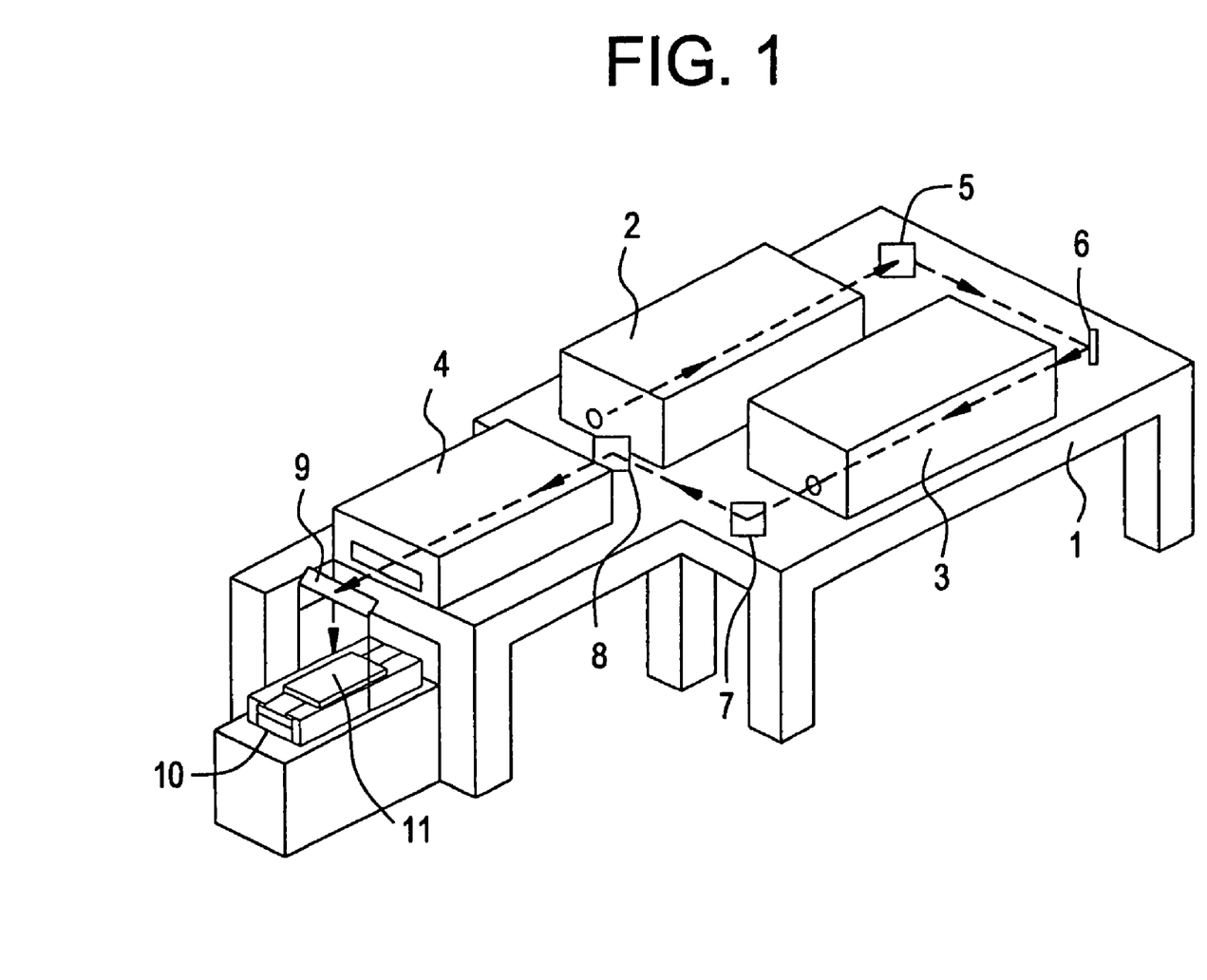
FIG. 1 shows a general configuration of a laser light irradiation apparatus.

First, a description will be made of an apparatus. FIG. 1 is a conceptual diagram of a laser annealing apparatus used in this embodiment. KrF excimer laser light (wavelength: 248 nm; pulse width: 25 ns) is emitted from an oscillator 2. Apparently other excimer lasers and lasers of other types can also be used.

Laser light emitted from the oscillator 2 are passed through full-reflection mirrors 5 and 6, amplified by an amplifier 3, and introduced into an optics 4 via full-reflection mirrors 7 and 8. The laser beam, which has a rectangular shape of about 3×2 cm² before entering the optics 4, is shaped by the optics 4 into a long and narrow beam (linear beam) of 10–30 cm in length and 0.1–1 cm in width. The laser light as output from the optics 4 has an energy of 1,000 mJ/shot at the maximum.

Shaping the laser light into such a long and narrow beam is to improve its workability. After being output from the optics 4, the linear beam is applied to a sample 11 via a full-reflection mirror 9. Since the beam is longer than the width of the sample 11, the entire sample 11 can be illuminated with laser light by moving the sample 11 only in one direction. Therefore, a sample stage and driving device 10 can be made simple in structure and maintained easily. Further, an alignment operation in setting the sample 11 can be performed easily.

The sample stage 10 to which laser light is irradiated is controlled by a computer, and is so designed as to move perpendicularly to the linear laser light. A heater is incorporated below the stage 10 to keep the sample 11 at a predetermined temperature during the laser light illumination.

Figure 2:
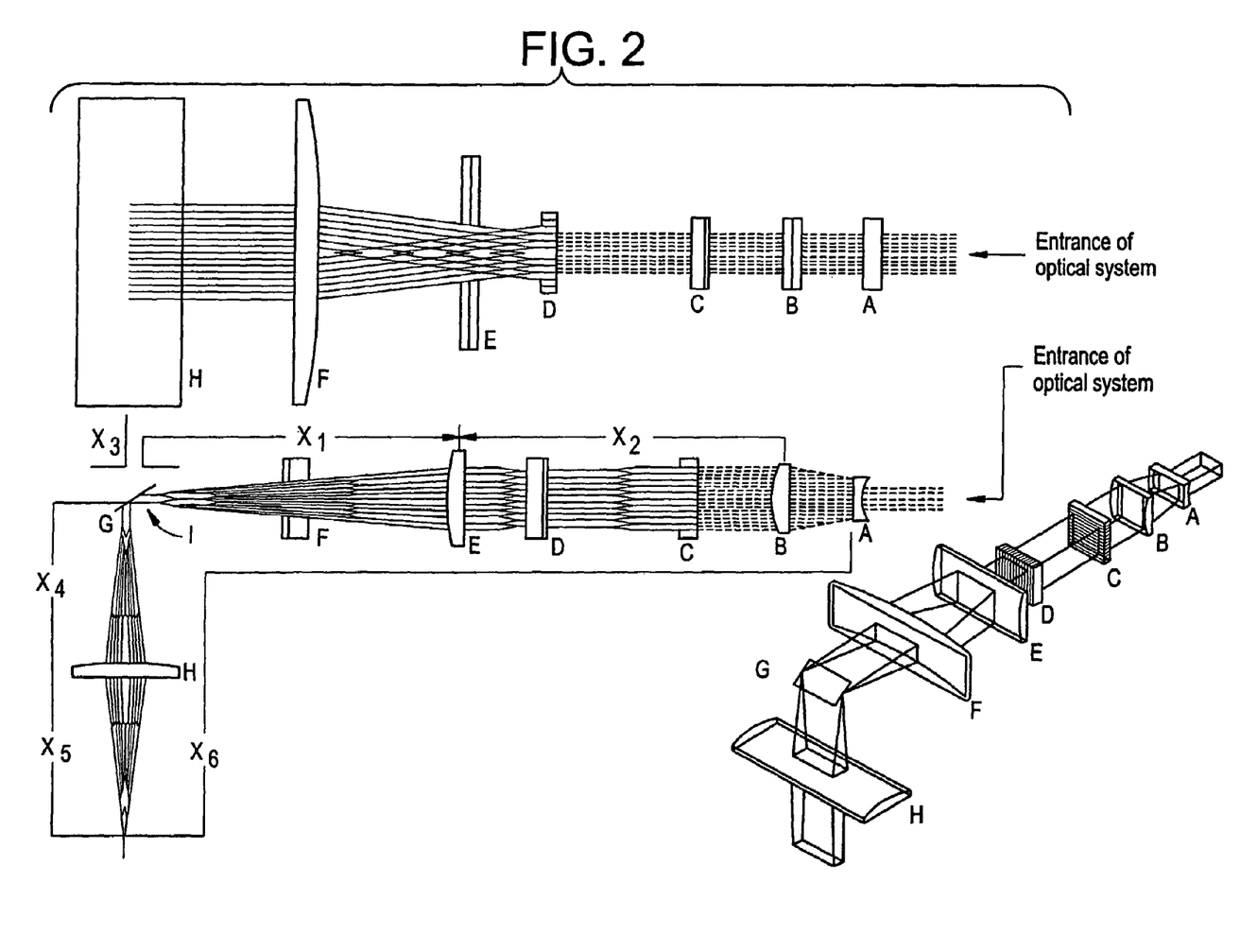
FIG. 2 shows an optics that is disposed in the laser light illumination apparatus;.

FIG. 2 shows an optical path inside the optics 4. The profile of the laser light is converted from a Gaussian distribution to a rectangular distribution while the laser light passes through a cylindrical concave lens A, a cylindrical convex lens B, horizontal fly-eye lenses C and D. Further, the laser light is passed through cylindrical convex lenses E and F, reflected by a mirror G (corresponding to the mirror 9 in FIG. 1), converged by a cylindrical lens H, and finally irradiated to the sample 11.

Figure 3:
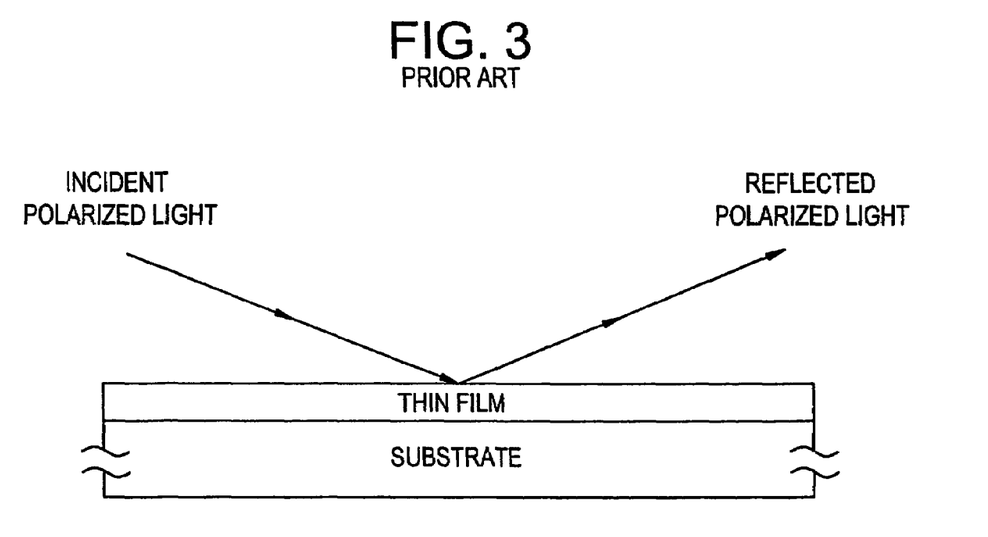
FIG. 3 shows the principle of ellipsometry.

FIG. 3 shows the principle of ellipsometry, which is to measure an apparent refractive index of a film. Based on the refractive index obtained by the ellipsometry, the crystallinity and the flatness of a silicon film can be evaluated at the same time.

As shown in FIG. 3, in the ellipsometry, polarized light is made obliquely incident on the surface of a measurement sample (thin film). The polarization state of the incident light is changed when it is reflected, and the amount of change depends on the thickness and the refractive index of the thin film. In the ellipsometry, the amount of change in the polarization state is measured and the thickness and the refractive index are determined from the amount of change thus measured. For example, if the thickness of a film is known, the refractive index can be determined.

In the following, an example of forming a crystalline silicon film on a glass substrate by illumination with laser light is described. First, a glass substrate (for instance, a Corning 7959 glass substrate) of 10 cm×10 cm is prepared. A 2,000-Å-thick silicon dioxide film, which is to serve as an undercoat film for preventing impurities from being diffused into a semiconductor film from the glass substrate side, is formed on the glass substrate by plasma CVD using TEOS as a material.

Then, an amorphous silicon film is deposited by plasma CVD. Alternatively, it may be deposited by low-pressure thermal CVD. In this example, the thickness of the amorphous silicon film is set at 500 Å. Apparently the thickness is not limited to this value, but may be set at any desired value. An oxide film is then formed on the surface of the amorphous silicon film by immersing the substrate into ammonium hydrate and keeping it at 70° C. for 5 minutes. Further, liquid-phase nickel acetate is coated on the surface of the amorphous silicon film by spin coating. The element of nickel serves to facilitate the crystallization of the amorphous silicon film.

Next, hydrogen is removed from the amorphous silicon film by leaving it for one hour in a nitrogen atmosphere of 450° C., to intentionally form dangling bonds in the amorphous silicon film, to thereby lower the threshold energy in a subsequent crystallization step. The amorphous silicon film is then crystallized by being subjected to a thermal treatment of 550° C. for 4 hours in a nitrogen atmosphere. Nickel contributes to reduction of the crystallization temperature to as low as 550° C.

In the above manner, a crystalline silicon film can be formed on the glass substrate. Then, KrF excimer laser light (wavelength: 248 nm; pulse width: 25 ns) is irradiated to the crystalline silicon using the apparatus shown in FIG. 1. The crystallinity can be improved by the illumination with the laser light.

The laser beam is shaped into a rectangular beam by a beam-shaped conversion lens, to obtain a beam area of 125 mm×1 mm on a portion to be illuminated. A sample is placed on the stage 10, and the entire surface of the sample is illuminated by moving the stage 10 at a speed rate of 2 mm/s. The laser light is irradiated in two stages: first at an energy density of 200 mJ/cm$^2$ and then at 250–350 mJ/cm$^2$ (main illumination). The pulse rate is 30 pulses/s. During the laser light illumination, the substrate temperature is kept at 200° C. The illumination is performed in the air, i.e., no atmospheric control is conducted.

FIG. 4 shows a result of a measurement in which the laser light illumination energy density of the second stage was varied from 250 to 350 mJ/cm$^2$ and refractive indices of crystalline silicon films were measured by the ellipsometry (a semiconductor laser of a wavelength 1,294 nm was used), whose principle has already been explained with reference to FIG. 3.

The "refractive index" mentioned above means a refractive index of a crystalline silicon film formed on a glass substrate as measured by the ellipsometry. Stated in a more detailed manner, where a measurement film is low in flatness, a refractive index as measured by the ellipsometry tends to be somewhat smaller than its true refractive index. The refractive index mentioned above is an apparent one that includes such a tendency. A smaller refractive index means that the film has a high degree of crystallinity. Therefore, the smaller the refractive index, the higher the crystallinity of the film and the lower in its flatness.

From the above discussion, it is concluded that a film having a required level of crystallinity and allowable flatness exhibits a refractive index that is within a certain range. In other words, a crystalline silicon film having a refractive index within a predetermined range should have crystallinity higher than a certain level and flatness within an allowable range.

It is understood from FIG. 4 that the refractive index of a crystalline silicon film and the energy density of illumination laser light have a proportional relationship. Naturally, since the illumination energy density of excimer laser light varies as described above, values on the horizontal axis of FIG. 4 are considered to be relative ones.

Each experimental data plotted in FIG. 4 is an average of data of five points on the film surface. A variation in measurement values of each set of five points was within 2%, which indicates that the film has good uniformity and the ellipsometry has high measurement accuracy.

As described above, in general, the refractive index measured by the ellipsometry tends to decrease as the degree of crystallization becomes higher or the surface flatness is more degraded. Utilizing this tendency, the inventors have invented the following laser processing method. The refractive index of a crystalline silicon film that has been subjected to excimer laser light illumination is measured. If the measured refractive index is smaller than a predetermined value, the illumination energy is reduced for the subsequent laser light irradiating operations. Conversely, if the measured refractive index is larger than the predetermined value, the illumination energy is increased. In this manner, crystalline silicon films can be obtained which always have a refractive index equal to or close to the predetermined value. That is, even if the absolute value of the laser light illumination energy is varied, crystalline silicon films can be obtained which always have crystallinity of a predetermined level and allowable flatness.

For example, in the above constitution in which an amorphous silicon film is crystallized by a heat treatment with the aid of Ni and the crystallinity of a resulting crystalline silicon film is improved by the illumination with KrF Excimer laser light, measurement results have been obtained which indicate that the crystalline silicon film should have a refractive index of not more than 3.5 so as to have not only a surface state that is not so deteriorated as to impair performance of a thin-film transistor produced by using the crystalline silicon film but also a sufficiently large field-effect mobility for driving of a thin-film transistor.

Measurements have proved that if the refractive index of a crystalline silicon film after being subjected to laser light illumination is larger than 3.5, the field-effect mobility of a thin-film transistor using such a film is smaller than 100, and that if it is smaller than 3.5, the field-effect mobility of a thin-film transistor is larger than 100. Therefore, for example, by forming a crystalline silicon film having a refractive index of 3.4, it can always provide a thin-film transistor having a field-effect mobility of more than 100.

However, it should be noted that if the refractive index is too small, the flatness of a film is so degraded that the film is not suitable for a thin-film transistor.

The ellipsometric measurement explained in this embodiment is very safe, and can be performed very easily in an extremely short time (several tens of seconds). Therefore, the laser light illumination can always be performed at an energy density having a predetermined absolute value by measuring the refractive index of a crystalline silicon film formed on a substrate by the ellipsometry, for instance, after processing of each substrate, and then controlling the illumination energy density for processing of the next substrate based on the thus-measured refractive index value. Thus, a variation in the effects of the laser light illumination in processing substrates can be suppressed. This fact enables mass-production of semiconductor devices, for instance, thin-film transistors, having predetermined characteristics. Although in this embodiment a substrate is scanned by a linear laser beam, a laser beam may be irradiated to a substrate so as to cover its entire surface.

Embodiment 2

This embodiment is directed to formation of a thin-film transistor by use of the technique of the first embodiment. FIGS. 5(A)–5(D) show manufacturing steps of a thin-film transistor. In this embodiment, a glass substrate 501 is used as the substrate. A 2,000-Å-thick silicon dioxide film (not shown) is formed, as an undercoat film, on the surface of the glass substrate 501.

First, a 500-Å-thick amorphous silicon film 502 is formed on the glass substrate 501 by plasma CVD or low-pressure thermal CVD. Ultraviolet light is then applied to the surface of the amorphous silicon film 502 in an oxygen atmosphere. After the surface is cleaned, a very thin oxide film is formed on the cleaned surface. A solution of nickel acetate is applied to form a liquid film 503, and then spin-coated with a spinner 500 (see FIG. 5(A)).

Figure 5A:
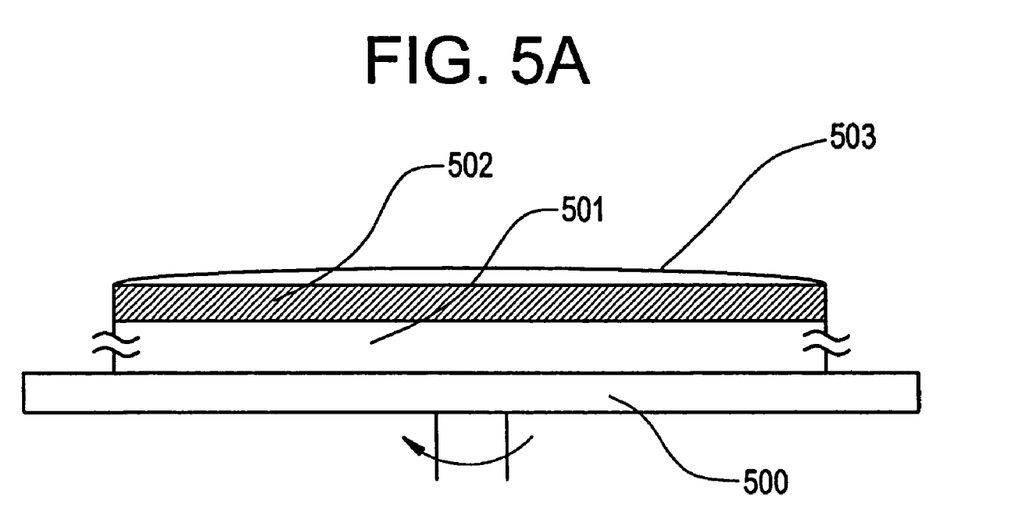
FIGS. 5(A)–5(D) show manufacturing steps of a thin-film transistor.

Next, the substrate is subjected to a heat treatment of 450° C. for one hour in an inert gas atmosphere to remove hydrogen from the amorphous silicon film 502 and form a layer of a nickel-silicon compound on the surface of the amorphous silicon film.

Then, the substrate is subjected to a heat treatment of 550° C. and four hours in an inert gas atmosphere to diffuse nickel into the film and effect its crystallization. Thus, a crystalline silicon film 504 is obtained. KrF excimer laser light is applied to the crystalline silicon film 504 by using the apparatus of FIG. 1 to improve its crystallinity.

The refractive index of the crystalline silicon film 504 is measured by the ellipsometry after one substrate is processed. If the measured refractive index value is larger than a predetermined value (for instance, 3.4), the setting value of the laser light illumination energy is increased. Conversely, if it is smaller than the predetermined value, the illumination energy is reduced. The next substrate is thereafter subjected to the laser light illumination. In this manner, as substrates are processed consecutively, crystalline silicon films can always be obtained which have refractive indices equal to or close to the predetermined refractive index; that is, crystalline silicon films in a desired state (having desired film quality) can be obtained.

Figure 6A:
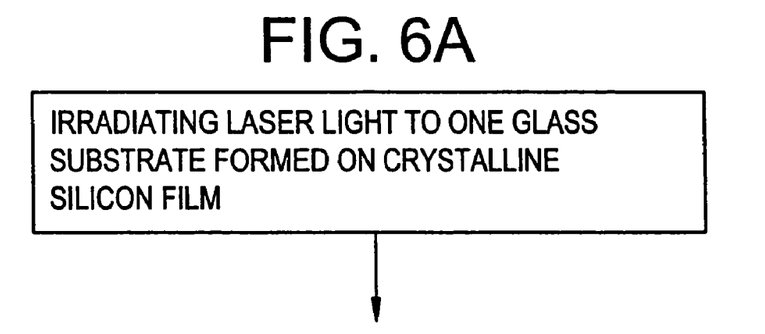
FIGS. 6(A) to 6(C) show a flowchart of a step of forming a crystalline silicon film by use of laser light.
Figure 6B:
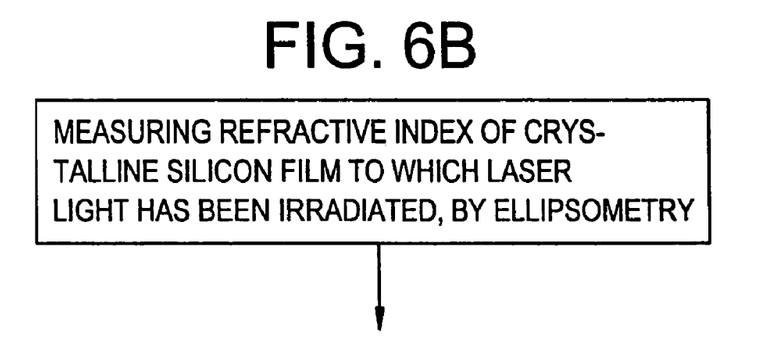
Figure 6C:
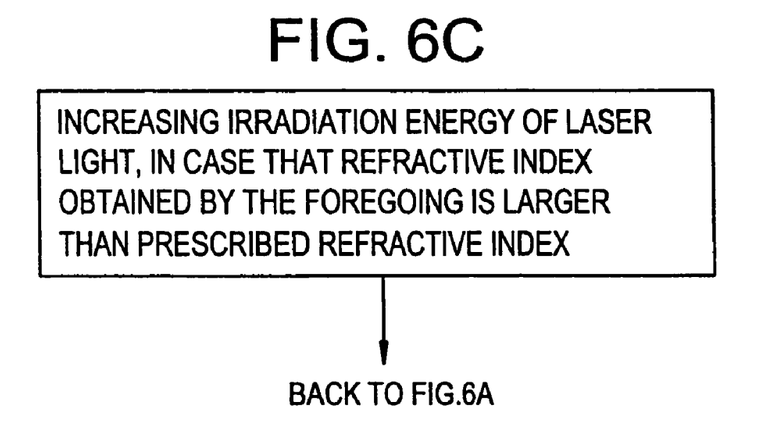

FIG. 6 is a flowchart of the laser light illumination step. Parts (A) to (C) of FIG. 6 correspond to a process for one substrate. By feeding back a result of operation (C) to operation (A), correction can be made for a variation of the laser light illumination energy density that changes gradually. Thus, the variation can always be suppressed to a minimum value.

In the method of FIG. 6, the laser light illumination conditions are adjusted after processing of each substrate. Alternatively, the refractive index of a crystalline silicon film on the fifth substrate may be measured by the ellipsometry after processing of each set of, for instance, five substrates, and the setting of the laser light illumination energy density may be adjusted for the next substrate based on the thus-measured refractive index.

Figure 5B:
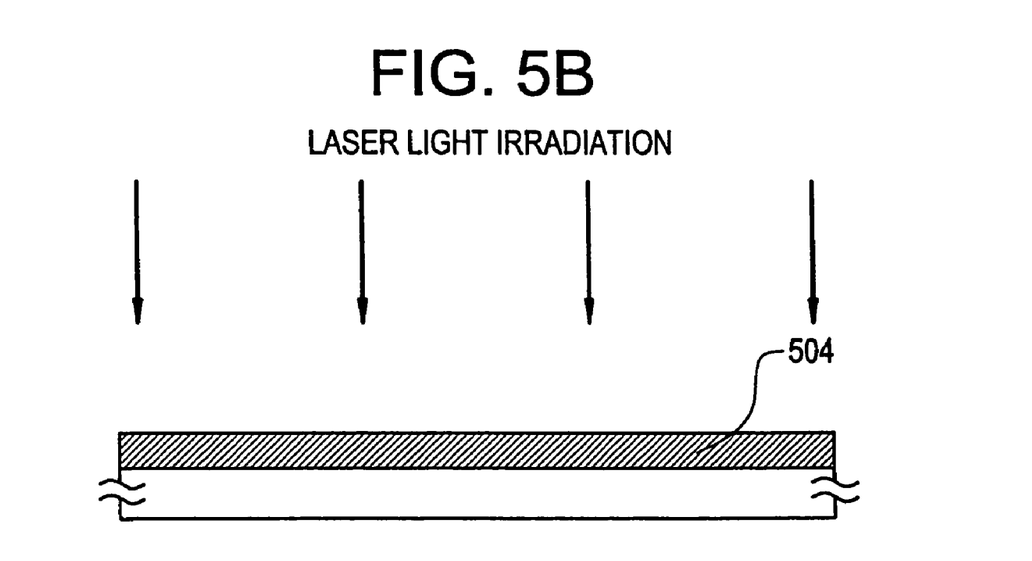
Figure 5C:
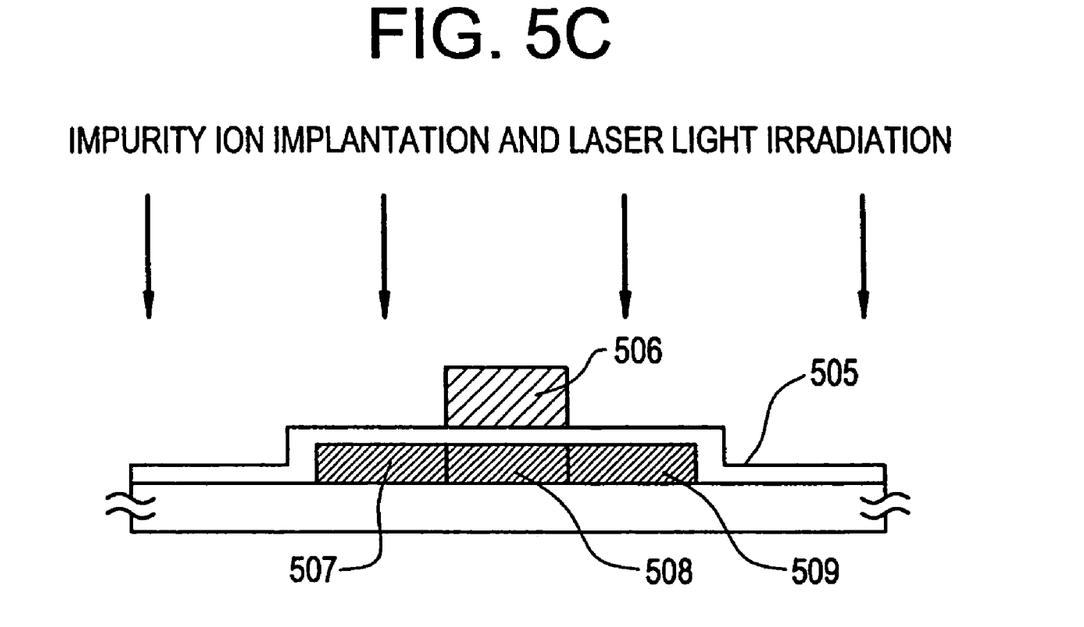

After the crystalline silicon film 504 is obtained by the substep of FIG. 5(B), patterning is performed to form an active layer of a thin-film transistor, which layer is a semiconductor layer including regions 507–509 (see FIG. 5(C)).

Subsequently, a 1,000-Å-thick silicon dioxide film 505 to serve as a gate insulating film is formed by plasma CVD or sputtering. A gate electrode 506 is then formed with a metal such as aluminum or a silicon semiconductor heavily doped with impurities that impart a single conductivity type. The source region 507 and the drain region 509 are formed by ion implantation (or plasma doping) of impurities that impart a single conductivity type using the gate electrode 506 as a mask. The channel forming region 508 is formed at the same time.

Figure 7A:
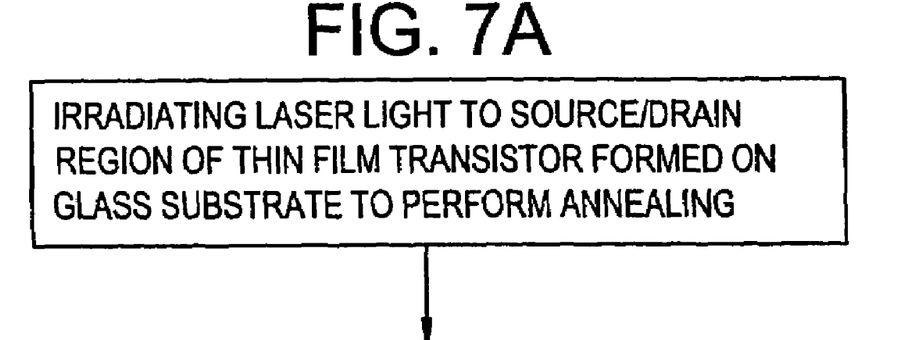
FIGS. 7(A) to 7(C) show a flowchart of laser light annealing in a thin-film transistor forming step.
Figure 7B:
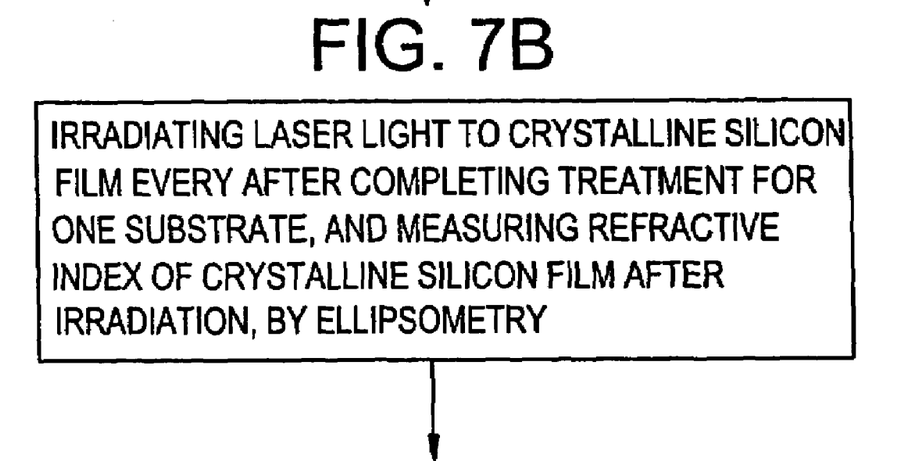
Figure 7C:
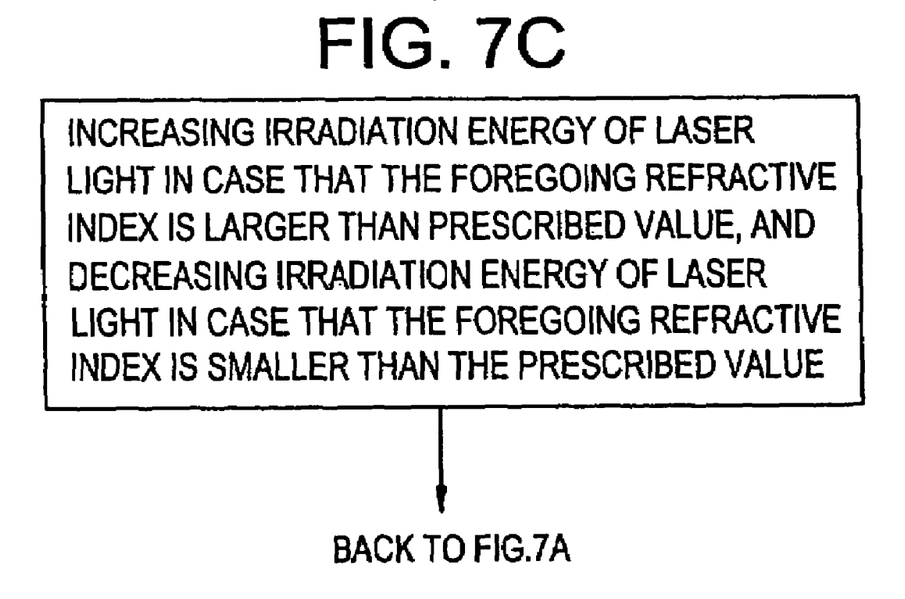

Referring to FIG. 7, laser light illumination is then performed to re-crystallize the source region 507 and drain region 509 which have been de-crystallized by the ion impact and to activate the implanted impurities. To make the laser light illumination energy density constant, a separate sample substrate in the state of FIG. 5(B) is prepared, laser light is irradiated to the sample substrate each time the processing of one substrate, for instance, is finished, and the refractive index of its illumination area is measured by the ellipsometry. The laser light illumination conditions for the next substrate are set based on the thus-measured refractive index value.

That is, the laser light illumination conditions are always controlled based on the refractive index of a sample substrate. More specifically, the setting is changed to increase the laser light illumination energy density if the refractive index of a sample substrate is larger than a predetermined value, and to decrease the illumination energy density if the refractive index is smaller than the predetermined value. In this manner, correction is made for a variation of the laser light illumination energy density every time the processing of one substrate is finished, so that the illumination energy density can be made close to a particular value. As a result, the laser light illumination density can be made approximately constant for respective substrates, to always provide the same annealing conditions.

Figure 5D:
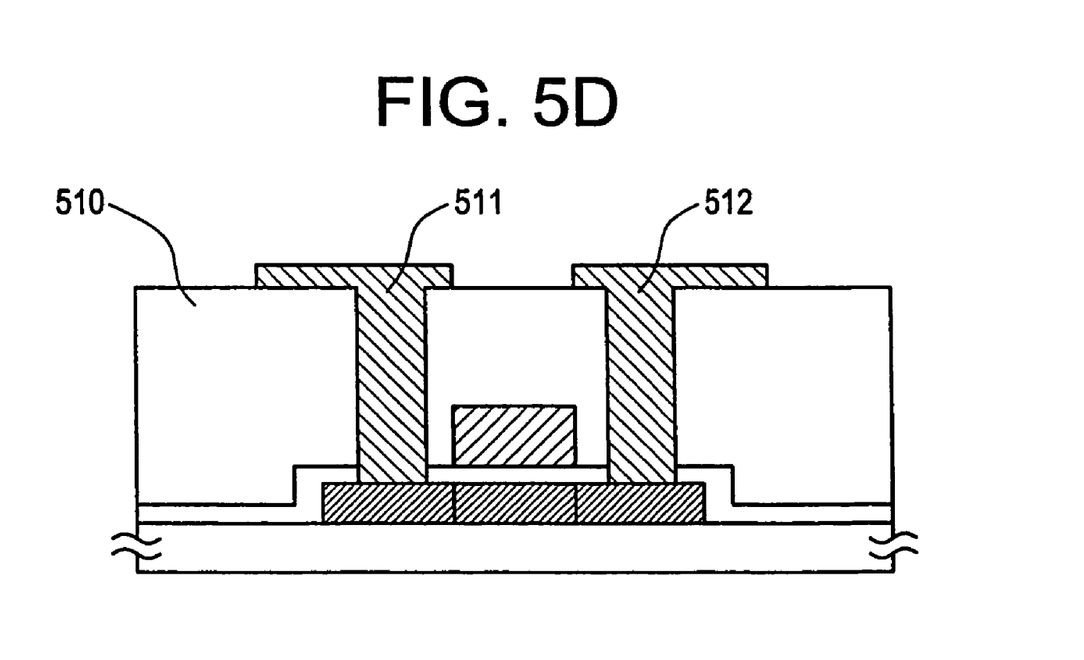

Next, an interlayer insulating film 510 is formed on the substrate of FIG. 5(C) with an insulative material such as silicon oxide or a combination of silicon dioxide and silicon nitride. After formation of holes, a source electrode 511 and a drain electrode 512 are formed. A gate electrode (not shown) is formed at the same time. The substrate is then subjected to a heat treatment of 350° C. for one hour in a hydrogen atmosphere to neutralize dangling bonds in the active later. Thus, a thin-film transistor is completed.

With the constitution of this embodiment, thin-film transistors can be formed by using crystalline silicon films that are always in a state close to a particular state, and the laser light annealing (of the source and drain regions) can always be performed under conditions close to particular ones. Therefore, thin-film transistors having almost identical characteristics can be obtained.

Embodiment 3

This embodiment is directed to a technique of correcting the laser light illumination conditions on a realtime basis. The data of FIG. 4 represent a relationship between refractive indices (as measured by the ellipsometry) of crystalline silicon films whose crystallinity has been improved by illumination with KrF excimer laser light and illumination energy densities (mJ/cm$^2$) of laser light used. As mentioned above, the illumination energy densities of FIG. 4 do not represent actual energy densities of laser light used.

However, it is understood that the refractive index of a crystallinity-improved crystalline silicon film and the energy density of illumination laser light has a relative relationship that is proportional as shown in FIG. 4. Therefore, by constantly controlling the laser light illumination energy so as to provide a predetermined refractive index, a constant illumination energy density value can always be obtained.

Therefore, where it is necessary to perform illumination using laser light of a constant output, the illumination energy density of laser light can be calibrated when necessary by separately preparing a monitoring crystalline silicon film and causing the laser-light-irradiated crystalline silicon film to always have a constant refractive index.

For example, a consideration will be made of a case where it is necessary to irradiate laser light having predetermined energy to an illumination object body. In this case, a monitoring silicon film is separately prepared, and the refractive index of the silicon film crystallized or crystallinity-improved by the laser light illumination is measured for each necessary manufacturing step. The laser light illumination energy is so changed that the measured refractive index value becomes close to a predetermined value. As a result, a correction (calibration) can always be effected so as to make the laser light illumination energy closer to a particular value every time an operation using the monitoring silicon film substrate is performed. That is, the laser light illumination energy can be made to fall within a certain range.

The above constitution can be applied to various processing apparatuses using laser light, such as an annealing apparatus, a working apparatus and a cutting apparatus.

As described above, according to the invention, various processing effects caused by laser light illumination can be evaluated by measuring the refractive index of a thin film whose quality is changed by illumination with laser light. Further, by measuring the refractive index of a thin film whose quality is changed by illumination with laser light, the illumination energy value of laser light can be evaluated in a relative manner. This fact enables the laser light illumination energy to be controlled so as to become equal or close to a particular value.

By utilizing the present invention, a laser light annealing operation is allowed to always exhibit the same effects. Therefore, for example, it becomes possible to manufacture thin-film transistors having almost identical characteristics. It becomes possible to evaluate, easily and simultaneously, the crystallinity of a crystalline silicon film for thin-film transistors and its flatness.

The present invention can be applied to manufacture of various semiconductors and control of illumination energy or power of laser light.

What is claimed is:

1. A method for manufacturing a semiconductor device comprising the steps of:
    forming a semiconductor film over a substrate; irradiating a laser light onto the semiconductor film to crystallize the semiconductor film,
    controlling an irradiation energy of the laser light based on a refractive index of the semiconductor film on which the laser light has been irradiated so that the refractive index of the semiconductor film is within a predetermined range;
    forming an active layer by patterning the crystallized semiconductor film;
    forming a gate insulating film over the active layer; and
    forming a gate electrode over the gate insulating film,
    wherein the refractive index is measured by an ellipsometer.

2. The method according to claim 1, wherein the laser light is selected from the group consisting of KrF excimer laser light, ArF excimer laser light and XeCl excimer laser light.

3. The method according to claim 1, wherein the irradiating step is performed by relatively scanning the laser light with respect to the substrate.

4. A method for manufacturing a semiconductor device comprising the steps of:
    forming a semiconductor film formed over a substrate irradiating a laser light onto the semiconductor film to crystallize the semiconductor film;
    controlling an irradiation energy of the laser light based on a refractive index of the semiconductor film on which the laser light has been irradiated;
    forming an active layer by patterning the crystallized semiconductor film;
    forming a gate insulating film over the active layer; and
    forming a gate electrode over the gate insulating film,
    wherein the laser light is repeatedly irradiated onto the semiconductor film until the refractive index of the semiconductor film becomes within a predetermined range,
    wherein the refractive index is measured by an ellipsometer.

5. The method according to claim 4, wherein the laser light is selected from the group consisting of KrF excimer laser light, ArF excimer laser light and XeCl excimer laser light.

6. The method according to claim 4, wherein the irradiating step is performed by relatively scanning the laser light with respect to the substrate.

7. A method for manufacturing a semiconductor device comprising the steps of:
    forming a semiconductor film formed over a substrate;
    irradiating a first laser light onto the semiconductor film to crystallize the semiconductor film;
    irradiating a second laser light onto the semiconductor film to further crystallize the semiconductor film;
    forming an active layer by patterning the crystallized semiconductor film;
    forming a gate insulating film over the active layer; and
    forming a gate electrode over the gate insulating film,
    wherein an irradiation energy of the second laser light is controlled so that a refractive index is within a predetermined range,
    wherein the refractive index is measured by an ellipsometer.

8. The method according to claim 7, wherein each of the first and second laser lights is selected from the group consisting of KrF excimer laser light, ArF excimer laser light and XeCl excimer laser light.

9. The method according to claim 7, wherein the irradiating step using each of the first and second laser lights is performed by relatively scanning the laser light with respect to the substrate.

10. A method for manufacturing a semiconductor device comprising the steps of:
    forming a semiconductor film formed over a substrate;
    irradiating a first laser light onto the semiconductor film to crystallize the semiconductor film;
    measuring a first refractive index of the semiconductor film on which the first laser light has been irradiated;
    irradiating a second laser light onto the semiconductor film to further crystallize the semiconductor film;
    measuring a second refractive index of the semiconductor film on which the second laser light has been irradiated;
    forming an active layer by patterning the crystallized semiconductor film;
    forming a gate insulating film over the active layer; and
    forming a gate electrode over the gate insulating film,
    wherein an irradiation energy of the second laser light is controlled based on the first refractive index.

11. The method according to claim 10, wherein each of the first and second laser lights is selected from the group consisting of KrF excimer laser light, ArF excimer laser light and XeCl excimer laser light.

12. The method according to claim 10, wherein the irradiating step using each of the first and second laser lights is performed by relatively scanning the laser lights with respect to the substrate.

13. The method according to claim 10, wherein the first and second refractive index are measured by an ellipsometer.

14. A method for manufacturing a semiconductor device comprising the steps of:
    forming a first semiconductor film over a first substrate;
    irradiating a first laser light onto the first semiconductor film to crystallize the first semiconductor film;
    measuring a refractive index of the first semiconductor film;
    forming a second semiconductor film formed over a second substrate;
    irradiating a second laser light onto the second semiconductor film to crystallize the second semiconductor film;

forming an active layer by patterning the crystallized second semiconductor film;

forming a gate insulating film over the active layer; and forming a gate electrode over the gate insulating film, wherein an irradiation energy of the second laser light is controlled based on the refractive index of the first semiconductor film so that the refractive index of the second semiconductor film is within a predetermined range.

15. The method according to claim 14, wherein each of the first and second laser lights is selected from the group consisting of KrF excimer laser light, ArF excimer laser light and XeCl excimer laser light.

16. The method according to claim 14, wherein the irradiating step using the first light is performed by relatively scanning the first laser light with respect to the first substrate.

17. The method according to claim 14, wherein the irradiating step using the second light is performed by relatively scanning the second laser light with respect to the second substrate.

18. The method according to claim 14, wherein the refractive index is measured by an ellipsometer.

* * * * *